United States Patent
Van Hal et al.

(10) Patent No.: US 11,740,566 B2
(45) Date of Patent: Aug. 29, 2023

(54) LITHOGRAPHY APPARATUS

(71) Applicant: ASML NETHERLANDS B.V., Veldhoven (NL)

(72) Inventors: Paulus Albertus Van Hal, Waalre (NL); Adrianus Hendrik Koevoets, Mierlo (NL); Beatriz Seoane De La Cuesta, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/790,986

(22) PCT Filed: Dec. 16, 2020

(86) PCT No.: PCT/EP2020/086442
§ 371 (c)(1),
(2) Date: Jul. 6, 2022

(87) PCT Pub. No.: WO2021/144108
PCT Pub. Date: Jul. 22, 2021

(65) Prior Publication Data
US 2023/0068088 A1 Mar. 2, 2023

(30) Foreign Application Priority Data
Jan. 14, 2020 (EP) .................................. 20151581

(51) Int. Cl.
*G03F 7/20* (2006.01)
*H01L 21/687* (2006.01)
*G03F 7/00* (2006.01)

(52) U.S. Cl.
CPC ............ *G03F 7/7095* (2013.01); *G03F 7/707* (2013.01); *G03F 7/70783* (2013.01); *H01L 21/6875* (2013.01)

(58) Field of Classification Search
CPC . G03F 7/16; G03F 7/167; G03F 7/707; G03F 7/70783; G03F 7/7095;
(Continued)

(56) References Cited

U.S. PATENT DOCUMENTS

| 5,514,501 A | 5/1996 | Tarlov |
| 6,952,253 B2 | 10/2005 | Lof et al. |

(Continued)

FOREIGN PATENT DOCUMENTS

| CN | 110366703 | 10/2019 |
| EP | 3299889 | 3/2018 |

(Continued)

OTHER PUBLICATIONS

International Search Report and Written Opinion issued in corresponding PCT Patent Application No. PCT/EP2020/086442, dated Mar. 29, 2021.

(Continued)

*Primary Examiner* — Deoram Persaud
(74) *Attorney, Agent, or Firm* — Pillsbury Winthrop Shaw Pittman, LLP

(57) ABSTRACT

A substrate with a backside surface configured to provide a friction switch when the substrate is loaded onto a substrate holder in a substrate-loading cycle, wherein the substrate backside surface has a molecular assembly including at least one high-interaction region and at least one low-interaction region. Further, there is provided methods using such a substrate and methods for creating such a substrate.

20 Claims, 10 Drawing Sheets

(58) Field of Classification Search
CPC . H01L 21/6875; G01S 13/0209; G01S 13/56; G01S 7/036; G01S 7/282; G01S 7/285; G01S 7/40; H03M 1/12
See application file for complete search history.

(56) References Cited

U.S. PATENT DOCUMENTS

| | | | |
|---|---|---|---|
| 2018/0025899 A1* | 1/2018 | Kang | H01L 21/306 216/89 |
| 2021/0223696 A1* | 7/2021 | Achanta | G03F 7/165 |
| 2023/0009692 A1* | 1/2023 | Lee | C23C 16/325 |

FOREIGN PATENT DOCUMENTS

| | | |
|---|---|---|
| TW | 201930645 | 8/2019 |
| WO | 03/033127 | 4/2003 |
| WO | 2019/108377 | 6/2019 |

OTHER PUBLICATIONS

Kim, H.I., et al.: "Molecularly Specific Studies of the Frictional Properties of Monolayer Films: a Systematic Comparison of CF3-, (CH3)2CH-, and CH3-Terminated Films," Langmuir, vol. 15, No. 9, pp. 3719-3185 (1999).

* cited by examiner

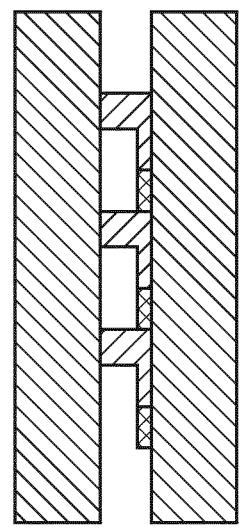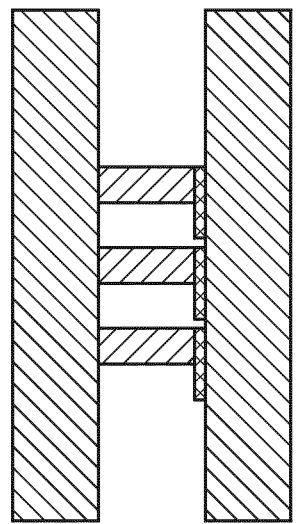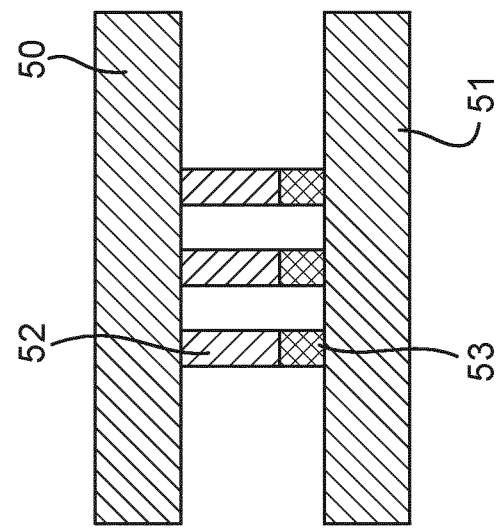
Fig. 6

LITHOGRAPHY APPARATUS

CROSS-REFERENCE TO RELATED APPLICATIONS

This application is the U.S. national phase entry of PCT Patent Application No. PCT/EP2020/086442 which was filed on Dec. 16, 2020, which claims the benefit of priority of European Patent Application No. 20151581.4 which was filed on Jan. 14, 2020 and which is incorporated herein in its entirety by reference.

FIELD

The present invention relates to lithographic apparatus, to methods of making such apparatus and to manufacturing devices, for example integrated circuits, using such apparatus.

BACKGROUND TO THE INVENTION

A lithographic apparatus is a machine constructed to apply a desired pattern onto a substrate. A lithographic apparatus can be used, for example, in the manufacture of devices, for example integrated circuits (ICs). A lithographic apparatus may for example project a pattern from a patterning device (e.g., a mask) onto a layer of radiation-sensitive material (resist) provided on a substrate.

The substrate in a lithographic apparatus is typically supported by a support mechanism, referred to as a substrate holder. When the substrate is a silicon wafer (for example, during integrated circuit manufacture), the support mechanism/substrate holder is typically referred to as a wafertable.

The wavelength of radiation used by a lithographic apparatus to project a pattern onto a substrate determines the minimum size of features that can be formed on that substrate. A lithographic apparatus that uses EUV radiation, that is electromagnetic radiation having a wavelength within the range 4-20 nm, may be used to form smaller features on a substrate than a lithographic apparatus using deep ultraviolet (DUV) radiation (for example with a wavelength of 193 nm).

As the size of features to be formed in a lithographic process reduces, the performance requirements on all aspects of the lithographic apparatus and materials become stricter.

Substrate holders used during device fabrication typically use burls to support the substrate, which reduces the chance of contaminant particles distorting the substrate and provides other advantages.

Typical semiconductor substrates have a thin layer of silicon, for example $SiO_x$ or $Si_xN_y$, on the backside of the substrate (e.g. the wafer backside), which can lead to the formation of Si—OH groups at the surface. This results in substrate backside surfaces that have high surface energies.

Distortions of the substrate caused during the process of loading a substrate, sometimes referred to as wafer load grid (WLG), are a significant contributor to overlay. WLG is affected by the surface energy of the materials involved i.e. the substrate backside and substrate holder materials.

During loading of a substrate into the substrate holder, the substrate makes contact with certain points of the substrate holder. Over time, mechanical wear of the substrate holder occurs, which can introduce displacement errors in the x and y directions. These errors have been observed to drift over time and are reflected in the WLG drift.

SUMMARY OF THE INVENTION

In view of the above, there remains a need to develop improved methods for minimising wafer load grid (WLG) in lithographic systems. There is also a need for systems and apparatus for lithographic processes comprising components resistant to WLG.

The present invention relates to a substrate with a backside surface configured to provide a friction switch when the substrate is loaded onto a substrate holder in a substrate-loading cycle; wherein the substrate backside surface comprises a molecular assembly comprising at least one high-interaction region and at least one low-interaction region.

The present invention also relates to a method comprising loading a substrate as defined herein onto a substrate holder; wherein the at least one low-interaction region of the substrate backside surface contacts the surface of the substrate holder before the at least one high-interaction region of the substrate backside surface during loading of the substrate.

The present invention also relates to a method comprising processing a substrate supported by a substrate holder, wherein the substrate is as defined herein.

The present invention also relates to a method of coating the backside surface of a substrate with a friction-switch coating, comprising applying a molecular species comprising at least one low-interaction region to a first portion of the backside surface of the substrate, and applying a molecular species comprising at least one high-interaction region to a second portion of the backside surface of the substrate.

The present invention also relates to a method of coating the backside surface of a substrate with a friction-switch coating, comprising applying a molecular species to a portion of the backside surface of the substrate, wherein the molecular species comprises at least one high-interaction and at least one low-interaction region.

The present invention also relates to a method of coating the backside of a substrate with a friction-switch coating, comprising applying a molecular species comprising at least one low-interaction region to a first portion of the backside surface of the substrate, and applying gas molecules comprising at least one high-interaction region to a second portion of the backside surface of the substrate, wherein at least a portion of the gas molecules adsorb onto the substrate backside surface.

The present invention also relates to a method of providing a friction-switch during loading of a substrate onto a substrate holder, comprising: applying a first molecular species comprising at least one low-interaction region to a first portion of the backside surface of the substrate; and applying a second molecular species to a second portion of the backside surface of the substrate; and loading the substrate onto the substrate holder; wherein the second molecular species reacts during loading of the substrate to form a high-interaction region.

The present invention also relates to a method of fabricating a device, the method comprising: a) loading a substrate onto a substrate holder; b) exposing the substrate to a radiation beam to produce an exposed substrate; and c) processing the exposed substrate to produce a device;
wherein the substrate is as defined herein.

The present invention also relates to a method of fabricating a device, the method comprising: a) applying a method of coating the backside surface of a substrate with a friction-switch coating as defined herein; b) exposing the substrate to a radiation beam to produce an exposed substrate; and c) processing the exposed substrate to produce a device.

Implementing such methods and systems reduces the frequency at which maintenance must be undertaken and substrate holders must be replaced, increasing throughput of the lithographic apparatus and the efficiency of device production

BRIEF DESCRIPTION OF THE DRAWINGS

FIG. 6 depicts a model of how 'long-range' and 'short-range' frictional interactions occur as a substrate is loaded onto a substrate holder.

DETAILED DESCRIPTION OF THE INVENTION

Figure 1:
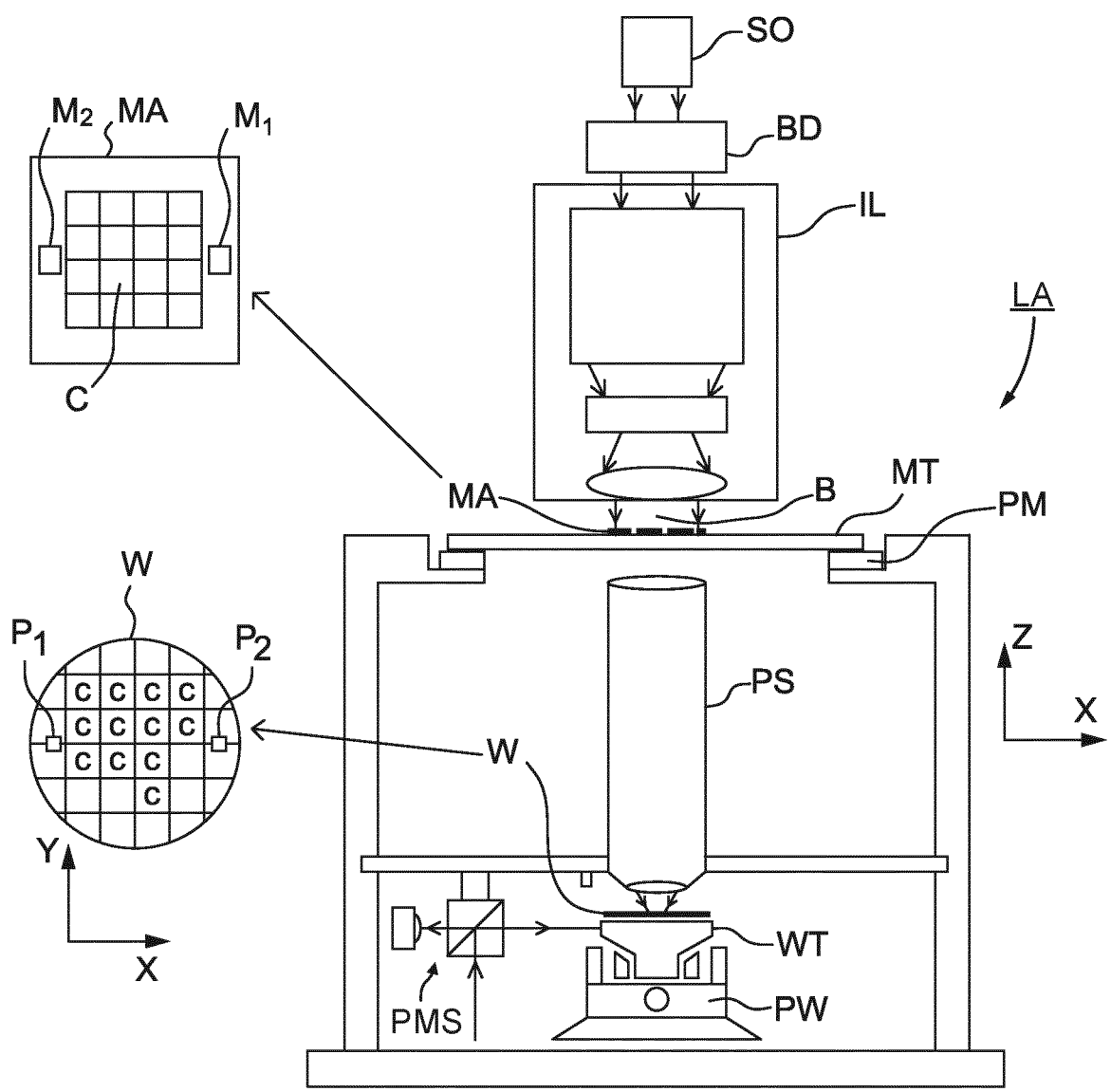
FIG. 1 is a schematic illustration of a lithographic system comprising a lithographic apparatus and a radiation source.

FIG. 1 schematically depicts a lithographic apparatus LA. The lithographic apparatus includes an illumination system (also referred to as illuminator) IL configured to condition a radiation beam B (e.g., EUV radiation or DUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a substrate table) WT constructed to hold a substrate (e.g., a resist coated wafer) W and connected to a second positioner PW configured to accurately position the substrate support WT in accordance with certain parameters, and a projection system (e.g., a refractive projection lens system)

PS configured to project a pattern imparted to the radiation beam B by patterning device MA onto a target portion C (e.g., comprising one or more dies) of the substrate W.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate W may be covered by an immersion liquid having a relatively high refractive index, e.g., water, so as to fill an immersion space between the projection system PS and the substrate W— which is also referred to as immersion lithography. More information on immersion techniques is given in U.S. Pat. No. 6,952,253, which is incorporated herein by reference.

The lithographic apparatus may be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus may comprise a measurement stage (not depicted in FIG. 1). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system PMS, the substrate support WT can be moved accurately, e.g., so as to position different target portions C in the path of the radiation beam B at a focused and aligned position Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

In a lithographic apparatus it is necessary to position with great accuracy the upper surface of a substrate or substrate to be exposed in the plane of best focus of the aerial image of the pattern projected by the projection system. To achieve this, the substrate or wafer can be held on a substrate holder or wafertable. The surface of the substrate holder that supports the substrate can be provided with a plurality of burls whose distal ends can be coplanar in a nominal support plane. The burls, though numerous, may be small in cross-sectional area parallel to the support plane so that the total cross-sectional area of their distal ends is a few percent, e.g. less than 5%, of the surface area of the substrate. The gas pressure in the space between the substrate holder and the substrate may be reduced relative to the pressure above the substrate to create a force clamping the substrate to the substrate holder.

Figure 2:
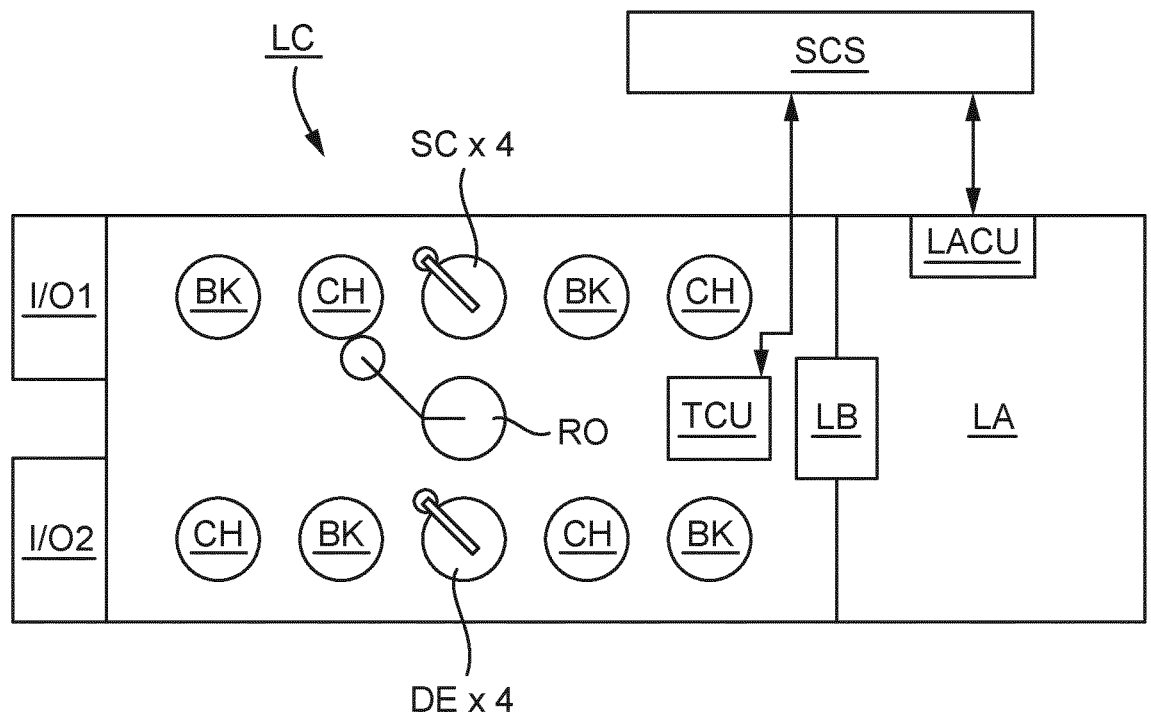
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/01, I/02, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In an embodiment the lithographic apparatus LA comprises a store unit. The store unit may be part of a substrate handler that controls movement of the substrate through the lithographic apparatus LA. When a substrate W is entered into a lithographic apparatus LA, the substrate W is positioned first on the store unit. Subsequently, the substrate W is moved from the store unit, after which the substrate W is positioned on the substrate table WT for an exposure process. Hence, the substrate W is positioned on the store unit before it is moved onto the substrate table WT.

Figure 3:
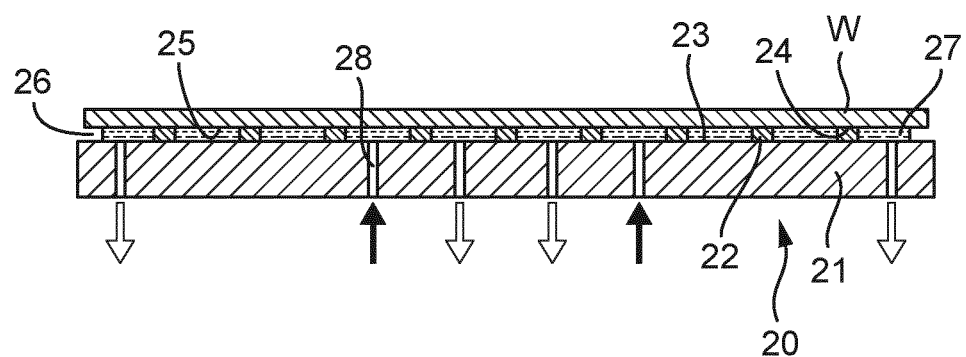
FIG. 3 depicts a substrate on a substrate support in a store unit of a lithographic apparatus.

In an embodiment the store unit comprises a substrate support 20. FIG. 3 depicts a substrate W on the substrate support 20. The substrate support 20 is configured to support the substrate W.

As shown in FIG. 3, the substrate support 20 comprises a main body 21. The main body 21 has a plate-like shape and may be approximately the same shape as the substrate W. For example, when the substrate W is circular, the main body 21 may correspondingly be circular. However, the shape of the main body 21 is not particularly limited. The main body 21 has an upper surface which forms a base surface 23 of the substrate support 20. In an embodiment, the base surface 23 of the substrate support 20 is electrically conductive. In an embodiment the substrate support 20 comprises a coating for the base surface 23.

FIG. 3 depicts that the base surface 23 of the substrate support 20 comprises a plurality of burls 22. Contact between a substrate backside 25 and the burl material at the top of the burl 24 in the presence of water, for example, at the gap 26 between the substrate W and the base surface 23, can lead to electrochemical corrosion of the burl material, for example the diamond-like carbon (DLC) coating of the burls 22. Over time, certain burls may change height, resulting in an uneven flatness degradation and a local angle focus problem as the image cannot be focussed properly on to the substrate W. Thus, the substrate holder 20 may no longer meet the strict performance requirements required for lithographic apparatus LA and must be replaced. Minimising the rate of burl corrosion is therefore key to maximising substrate holder life and efficiency of device production.

A wafer as discussed herein is one example of a substrate that may be supported by a substrate holder/support. When the substrate is referred to as a wafer, the substrate holder is typically referred to as a wafertable.

As set out above, wafer load grid (WLG) is a serious issue for lithography substrate holders. Local damage of substrate holders in the x, y and/or z direction has a negative impact on overlay (relative position errors between different layers in a device) at the nm level. This local damage may result from contact between the substrate and substrate holder during loading of the substrate. Over time, WLG drifts to higher values, resulting in overlay issues and reducing the lifetime of the substrate holder. Minimising the rate of burl wear is key to minimising the rate of WLG drift.

Figure 4:
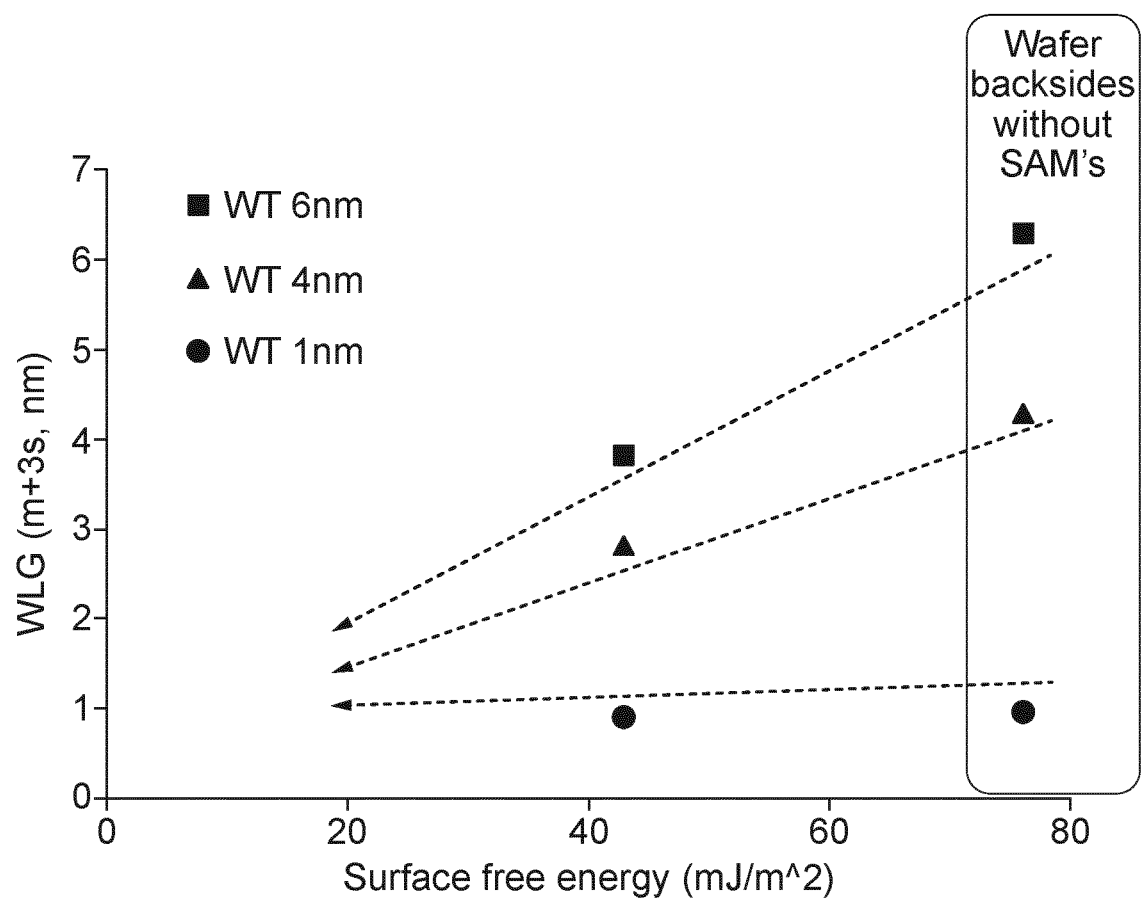
FIG. 4 shows how surface free energy of the substrate backside affects substrate holder WLG.
Figure 5A:
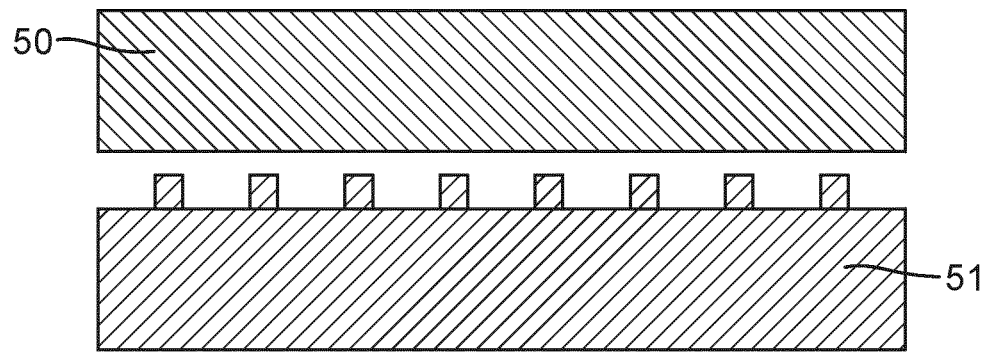
FIG. 5 depicts a model of loading a substrate onto a substrate holder.
Figure 5B:
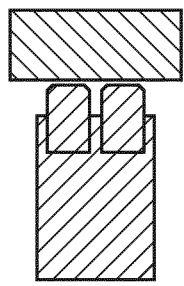
Figure 5C:
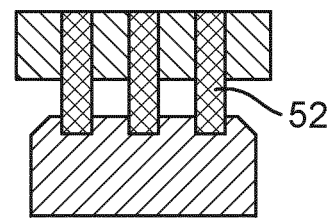
Figure 5D:
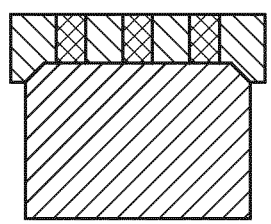

FIG. 4 shows that WLG of a substrate holder is significantly reduced when the backsides of the substrates used with the substrate holder are coated with low surface-energy coatings. In addition to reducing WLG, the coefficient of friction between the substrate backsides and the substrate holder is reduced by utilising such coatings.

During loading, a warped substrate makes contact with certain points of the substrate holder. Between the start of the loading process and clamping the substrate, overlay errors in the range of from about 1 to about 5 nm are introduced.

It is desirable to have a low friction coefficient (COF) between substrate and substrate holder during the start of the process of loading the substrate onto the substrate holder. This ensures that the substrate can be placed accurately and brought to the correct position on the substrate holder without causing mechanical wear of the substrate holder surface.

Conversely, it is desired to have a high COF between substrate and substrate holder once the substrate is in position on the substrate holder. This minimises movement of the substrate once it is in position, ensuring that is securely fixed in place before exposure of the substrate and able to maintain position even when subjected to high accelerations during the exposure process.

Thermal expansion of the substrate may occur during exposure. Having a high COF between the substrate and substrate holder minimises any movement of the substrate resulting from thermal expansion, minimising errors and increasing the accuracy of the lithographic process.

The value of the COF between the substrate backside surface and the substrate holder is proportional to the strength of interaction forces between the two surfaces, for example intermolecular forces and columbic forces.

The present invention arises from the finding that it is possible to improve the resistance of lithography substrate holders to mechanical wear and minimise WLG by utilising substrates with modified backside coatings with switchable friction properties.

The substrate can be made of any semiconducting material known in the art that may be used to produce substrates. For example, the substrate may be a silicon wafer, a silicon carbide wafer, a gallium nitride wafer, a gallium arsenide wafer or an aluminium titanium carbide wafer. Preferably, the substrate is a silicon wafer or a silicon carbide wafer.

The substrate holder comprises one or more of DLC, diamond, graphite, SiSiC, SiC, Zerodur, $Al_2O_3$, TiN, Lipocer, SST and/or CrN, and preferably comprises one or more of diamond-like carbon (DLC), diamond, graphite, SiSiC, SiC and/or CrN.

The term "switchable friction" or "friction switch" used herein refers to an increase in the COF between the surface of the substrate holder and the substrate backside which occurs when the average distance between the two surfaces is reduced i.e. when the substrate is loaded onto the substrate holder as part of a substrate-loading cycle.

In the present invention "substrate-loading cycle" refers to the process of loading a substrate onto a substrate holder.

FIG. 5 represents a substrate-loading cycle, i.e. the process of loading a substrate (50) onto a substrate holder (51). Initially (FIGS. 5B and 5C), only the tops of the burls of the substrate holder make contact with the substrate backside. Only long-range' interactions (52) occur between the two surfaces. However, as the substrate is loaded, a greater proportion of the surface of the substrate holder comes into contact with the substrate backside i.e. the average distance between the surface of the substrate holder and the substrate backside decreases. As show in FIG. 5D, at the illumination point (after clamping the substrate), the substrate holder is in close contact with and penetrates slightly into the substrate backside material. Thus, both long-range' and 'short-range' interactions occur between the two surfaces.

Therefore, at the start of the substrate-loading cycle only 'long-range' interactions occur between the two surfaces. At the end of the substrate-loading cycle, both 'long-range' and 'short-range' interactions occur.

Due to this change in the nature of the interactions occurring over the course of the wafer-loading cycle, the nature of the materials at the surface of the substrate backside can be adjusted to provide different COFs at different points in the substrate-loading cycle i.e. different interaction parameters as a function of load. Therefore, the switchable friction of the present invention can be achieved by adjusting substrate backside coatings.

FIG. 6 represents the general approach used to provide switchable friction. Molecular assemblies (52 and 53) are bonded to the substrate 50 backside. The low-interaction regions 53 of the molecular assemblies provide 'long-range' frictional interaction, while the high-interaction regions 52 provide 'short-range' frictional interaction. When the substrate backside first comes into contact with the substrate holder 51, only the long-range, low-interaction region of the substrate backside surface molecular assemblies contact the substrate holder. As such, only a 'low surface energy' group contacts the substrate holder, and the COF between the two surfaces is low. As the substrate backside is brought closer to the surface of the substrate holder, the short-range, high-interaction regions of the substrate backside surface molecular assemblies contact the substrate holder. Now, both the low surface energy (low-interaction), and the high surface energy (high-interaction) regions are in contact with the substrate holder, resulting in a higher COF. The COF between the substrate backside surface and the substrate holder has increased during the loading process, and a friction switch has occurred.

When the distance between the substrate holder and the substrate backside surface is minimised (i.e. at the end of the wafer-loading cycle), intermolecular forces between the substrate backside and the substrate holder are maximised as the maximum proportion of high-interaction and low-interaction regions of the substrate backside surface molecular assemblies are in contact with the substrate holder. Thus, the COF is maximised.

The molecular assembly may comprise a single type of molecule comprising both one or more high-interaction and one or more low-interaction regions. Alternatively, the molecular assembly may comprise a plurality of molecules (for example, two, three, four, five, six, seven, eight, nine, ten or more types of molecules), each of which may independently have one or more low-interaction regions and/or one or more high-interaction regions. When the molecular assembly comprises a plurality of molecules, it preferably comprises two, three or four types of molecules, more preferably two or three types of molecules and most preferably two types of molecules.

In the present invention, a "high-interaction region" is a region which can interact strongly with another species, resulting in a high COF when a surface comprising the high-interaction region is brought into contact with another surface. Preferably, a high-interaction region is able to interact via comparatively strong intermolecular forces (such as hydrogen-bonds and/or magnetic dipole-dipole interactions) and/or coulombic interactions when brought into contact with another species.

Preferably, a high-interaction region comprises one or more groups selected from an amine, alcohol, peroxy, ester, amide, urea, imine, imide, nitrile, ether, siloxy, alkoxy, acyl, carboxyl, acetyl and/or a charged group.

In the present invention, a "low-interaction region" is a region which can only interact weakly with another species, resulting in a low COF when a surface comprising the low-interaction region is brought into contact with another surface. Preferably, a low-interaction region is only able to interact via weak intermolecular forces (such as only Van der Waals forces) when brought into contact with another species. Preferably, a low-interaction region comprises a carbon chain comprising at least one moiety selected from —$CX_3$, —$CX_2H$, —$CXH_2$, —$CH_3$, —$CX_2$—, —$CXH$—, and/or —$CH_2$—, wherein X is independently selected from F and Cl, and is preferably F. Preferably, a low-interaction region comprises a carbon chain comprising only moieties selected from —$CX_3$, —$CX_2H$, —$CXH_2$, —$CH_3$, —$CX_2$—, —$CXH$—, and/or —$CH_2$—, wherein X is independently selected from F and Cl, and is preferably F. When the low-interaction region comprises a carbon chain, it preferably comprises 3 or more carbon atoms, preferably 4 or more carbon atoms, preferably 5 or more carbon atoms and most preferably 6 or more carbon atoms.

The COF at the start of the substrate-loading cycle (i.e. when only the low-interaction region of the substrate backside surface and the substrate holder are in contact) can take any value, provided it is less than the COF at the end of the substrate-loading cycle. Preferably, the COF at the start of the substrate-loading cycle is less than about 0.3, preferably less than about 0.25, preferably less than about 0.2, preferably less than about 0.15, preferably less than about 0.1, and preferably less than about 0.05.

The COF at the end of the substrate-loading cycle (i.e. when both the low-interaction and high-interaction regions of the substrate backside surface are in contact with the surface of the substrate holder) can take any value, provided it is greater than the COF at the start of the substrate-loading cycle. Preferably, the COF at the end of the wafer-loading cycle is greater than about 0.1, preferably greater than about 0.15, preferably greater than about 0.2, preferably greater than about 0.25, preferably greater than about 0.3, preferably greater than about 0.35, and preferably greater than about 0.4.

The COF increases by at least 0.01 during the substrate-loading cycle. Preferably, the COF increases by at least about 0.02, preferably by at least 0.05, preferably by at least about 0.1, preferably by at least about 0.15, preferably by at least about 0.2, preferably by at least about 0.25 and most preferably by at least about 0.3 during the substrate-loading cycle.

Using this approach requires no external source to facilitate the switch from low-friction to high-friction states—the friction switch occurs as a result of normal loading of the substrate onto the substrate holder in a substrate-loading cycle.

If the surface coverage of the molecular assembly on the substrate backside is too low, it may not be possible to achieve a sufficiently high COF to fix the substrate in position at the end of the substrate loading cycle. Conversely, if the coverage of the molecular assembly on the substrate backside is too high, there may not be sufficient space for the low-interaction regions of the molecular assemblies to be displaced as the substrate backside and the substrate holder are brought into close contact.

In the present invention, the molecular assembly may cover from about 1% to about 100% of the surface of the backside of the substrate. Preferably, the molecular assembly covers greater than about 5%, preferably greater than about 10%, preferably greater than about 20%, preferably greater than about 30%, and most preferably greater than about 40% of the surface of the substrate backside. Preferably, the molecular assembly covers less than about 95%, preferably less than about 90%, preferably less than about 80%, preferably less than about 70%, and most preferably less than about 60% of the surface of the substrate backside.

There are multiple approaches that may be used to obtain the friction switch of the present invention.

Figure 7:
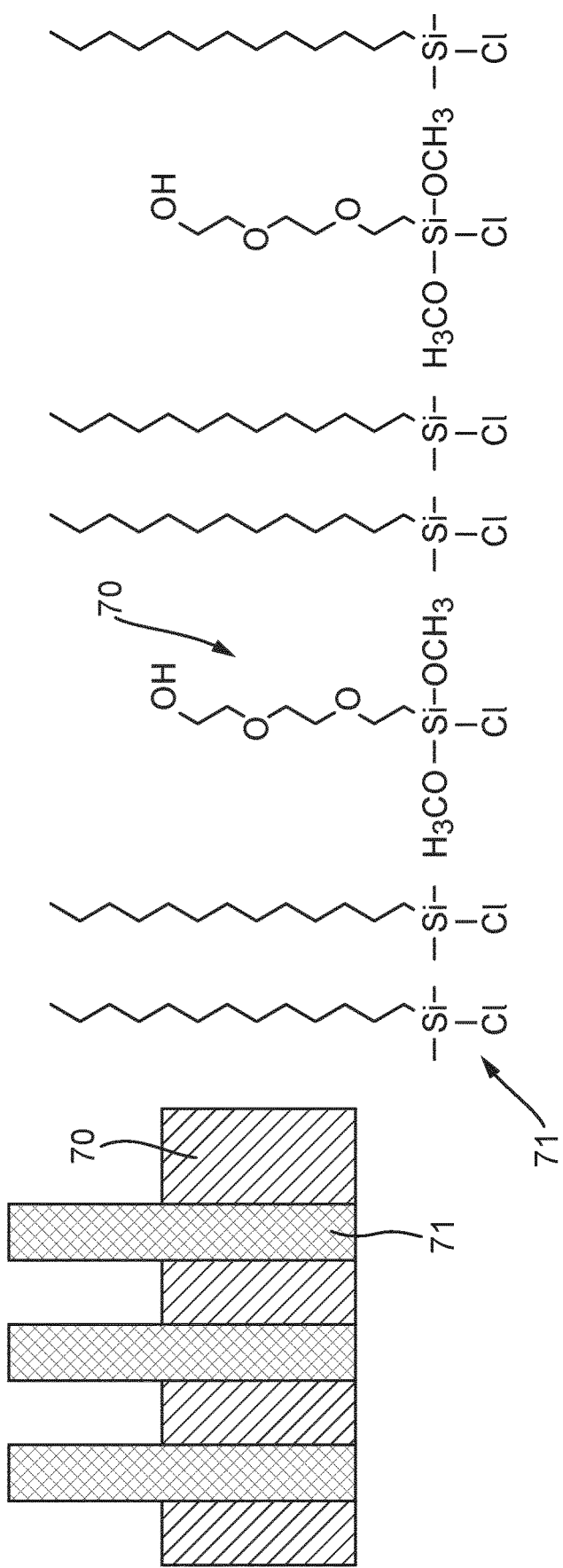
FIGS. 7 to 10 depict models of embodiments of the present invention.

In one embodiment, exemplified in FIG. 7 a substrate backside surface is used which comprises a molecular assembly (70 and 71) comprising short molecules comprising a high-interaction region 70 and longer molecules comprising a low-interaction region 71, with both types of molecule bonded to the surface of the substrate. On initial loading of the substrate, only the low-interaction regions of the long molecules contact the substrate holder, proving a low COF. As the substrate-loading cycle continues and the average distance between the substrate holder and the substrate backside surface decreases, both the low-interaction region of the long molecules and the high-interaction region of the short molecules contact the substrate holder, maximising the interaction forces and providing a high COF.

Figure 8:
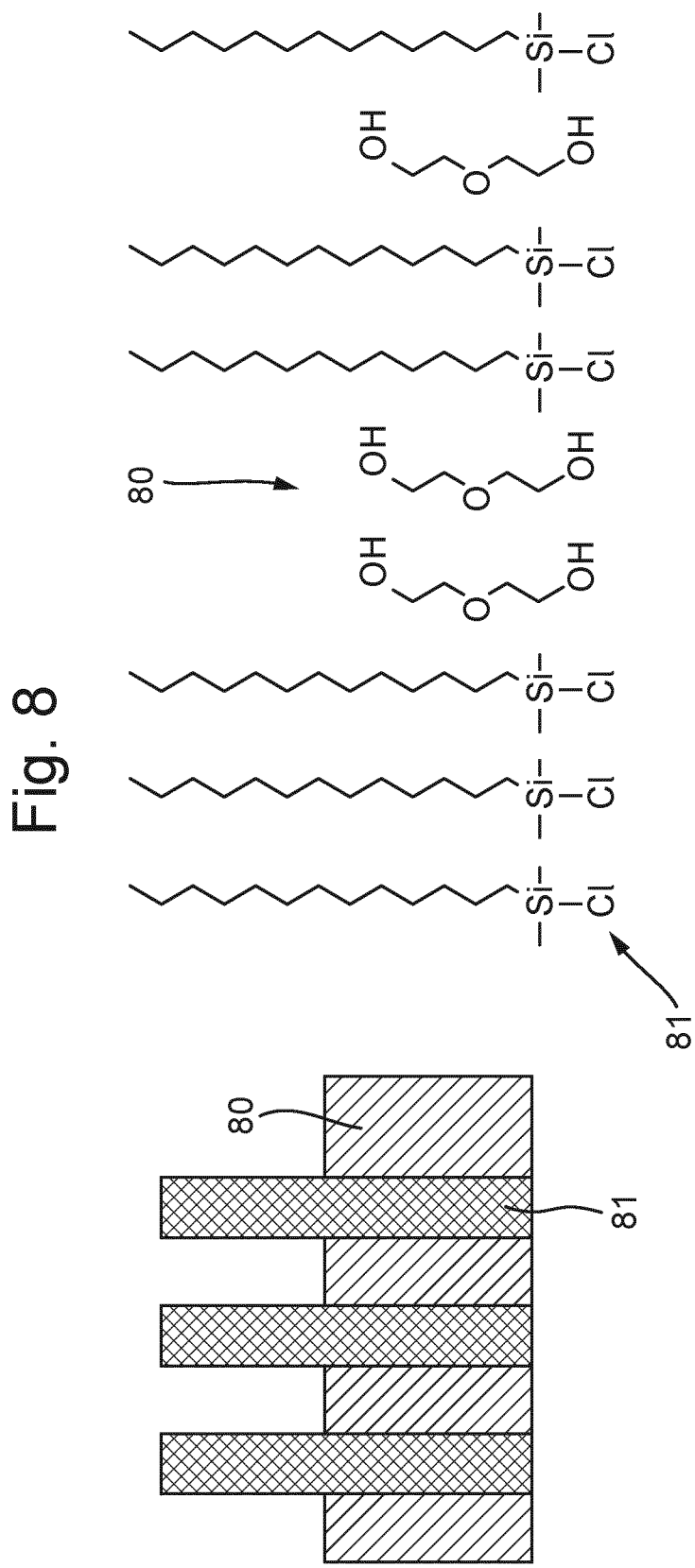

In a second embodiment, exemplified in FIG. 8, a substrate backside surface is used which comprises a molecular assembly (80 and 81) comprising long molecules comprising a low-interaction region 81 bonded to the substrate backside surface, with short molecules comprising a high-interaction region 80 adsorbed to the substrate backside surface. The molecules comprising a high-interaction region are physisorbed or chemisorbed to the substrate backside surface. In FIG. 8, the adsorbent molecules are diethylene glycol molecules, although any adsorbent molecules comprising a high-interaction region may be used. On initial loading of the substrate, only the low-interaction region of the long molecules contact the substrate holder, providing a low COF. As the substrate-loading cycle continues and the average distance between the substrate holder and the substrate backside surface decreases, both the low-interaction region of the long molecules and the high-interaction regions of the short adsorbent molecules contact the substrate holder, maximising the intermolecular forces and providing a high COF.

Figure 9:
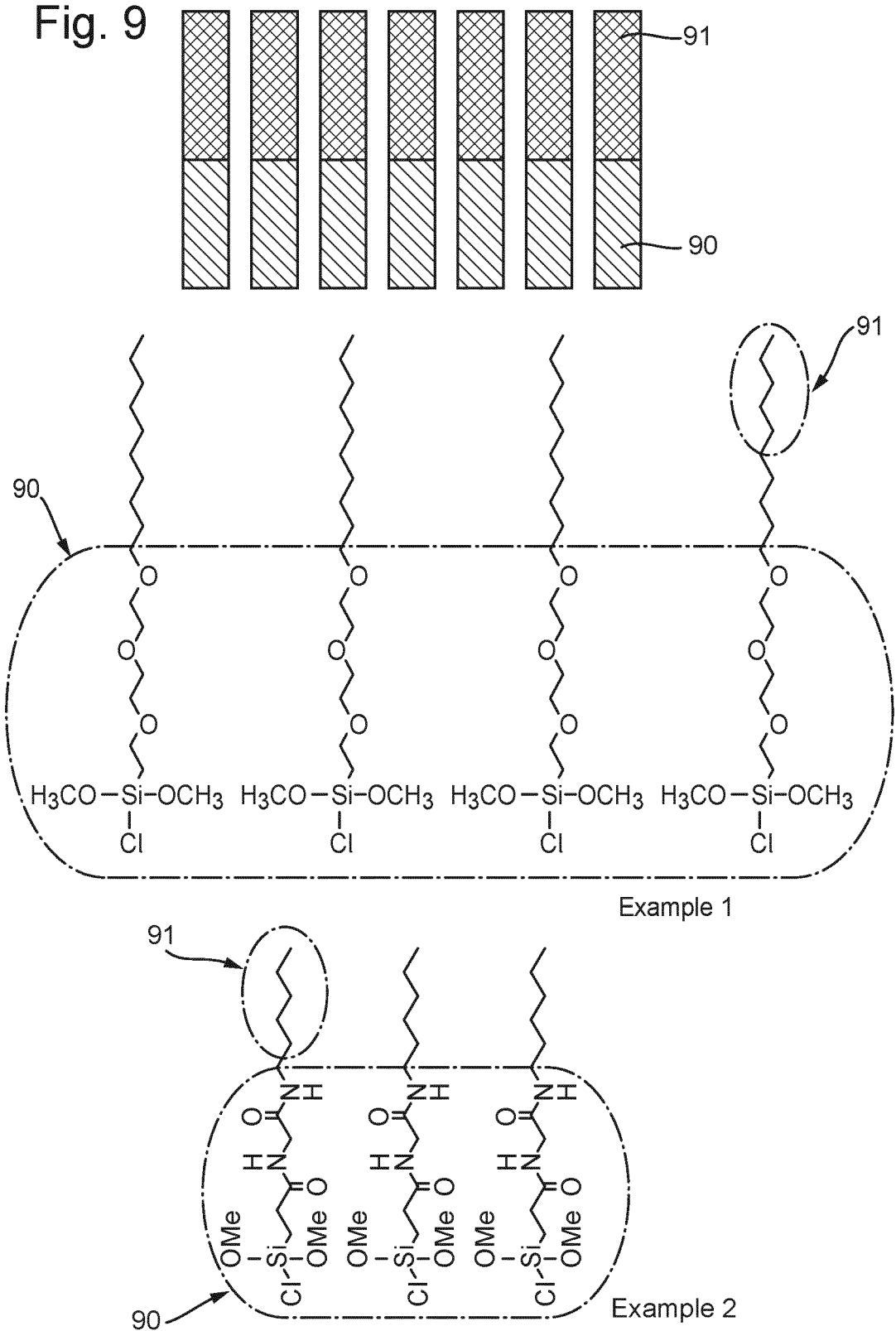

In a third embodiment, exemplified in FIG. 9, a substrate backside surface is used comprising a molecular assembly (90 and 91) which comprises molecules with a high-interaction backbone 90 and low-interaction head group 91. On initial loading of the substrate, only the low-interaction head groups contact the substrate holder, proving a low COF. As the substrate-loading cycle continues and the average distance between the substrate holder and the substrate backside surface decreases, both the low-interaction head groups and the high-interaction backbone contact the substrate holder, maximising the intermolecular forces and providing a high COF.

Figure 10:
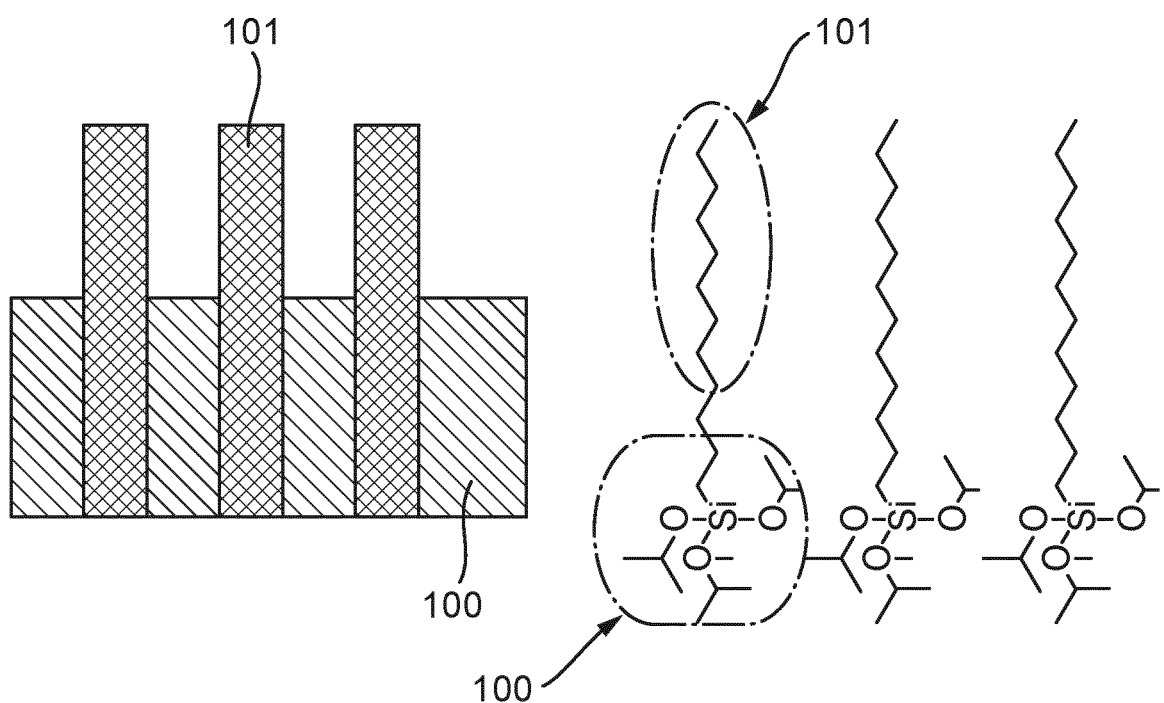

In a fourth embodiment, exemplified in FIG. 10, a long molecular species comprising at least one low-interaction region (100 and 101) is used. The long molecular species reacts during grafting to the wafer backside surface to release one or more short adsorbent molecules comprising a high-interaction region. At least a portion of these adsorbents molecules then adsorb to the substrate backside surface. On initial loading of the substrate, only the low-interaction region of the long molecular species contacts the substrate holder and provide a low COF. As the substrate-loading cycle continues and the average distance between the substrate holder and the substrate backside surface decreases, both the low-interaction region of the long molecular species and the high-interaction regions of the adsorbent molecules contact the substrate holder, providing a high COF.

In this embodiment, the long molecular species comprising at least one low-interaction region can be designed such that, during grafting onto the Si—OH surface, a useful molecule is released. Preferably, the useful molecule is a molecule comprising an alkoxy group. For example, in the scheme below, dodecyltriisopropoxysilane reacts with a surface R (for example, to —OH groups of a substrate backside surface) up to three times to release up to three molecules comprising high-interaction regions.

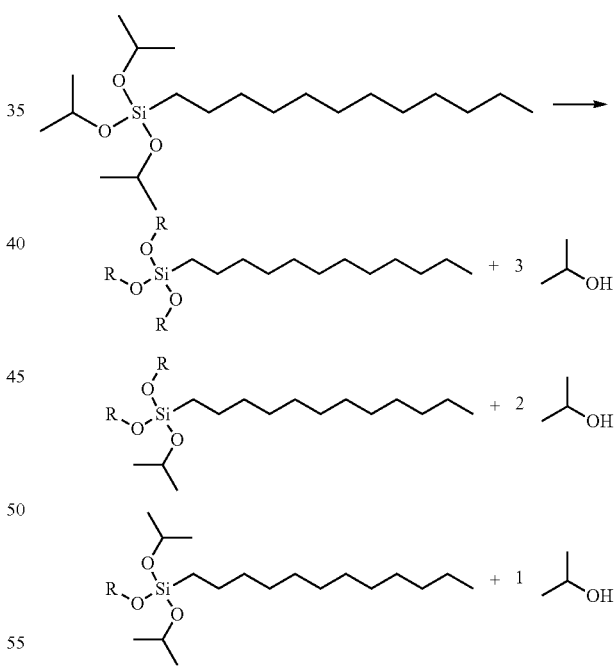

In this scheme, isopropanol molecules are released. However, the long molecular species comprising at least one low-interaction region can be tuned such that it releases adsorbent molecules with specific properties (for example, high interaction strength) when the long molecular species is grafted on to the substrate backside surface.

In a fifth embodiment, a substrate backside surface is used which comprises a molecular assembly comprising short molecules comprising one or more head-groups which can become charged, and longer molecules comprising a low-interaction region, with both types of molecule bonded to the surface of the substrate. On initial loading of the substrate, only the low-interaction regions of the long molecules contact the substrate holder and provide a low COF. As the substrate-loading cycle continues and the average distance between the substrate holder and the substrate backside surface decreases, the short molecules comprising one or more head-groups which can become charged come into contact with the substrate holder. This causes the head-groups to become charged and become high-interaction regions, resulting in strong coulombic interactions between the charged head-groups and the substrate holder surface. This results in strong interaction between the substrate backside surface and the substrate holder, increasing the COF.

Figure 11A:
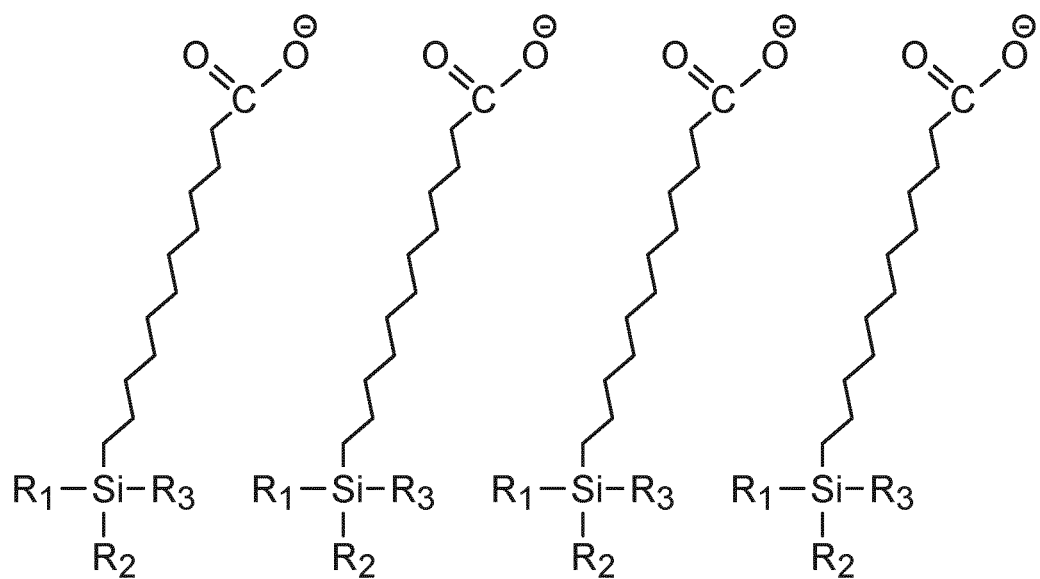
FIG. 11 depicts exemplary molecules comprising charged head-groups which may be used in a substrate backside surface coating.
Figure 11B:
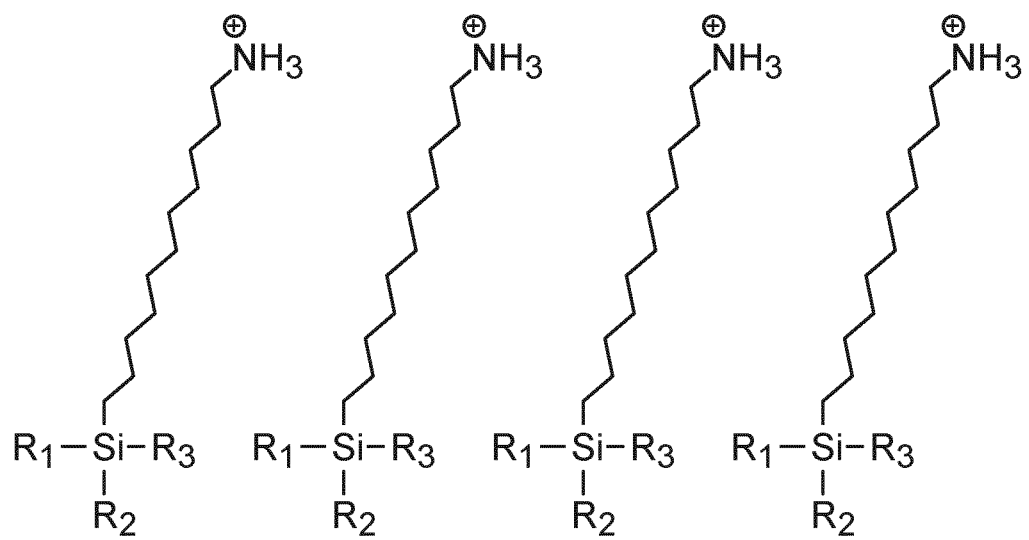

For example, a carboxyl group, i.e. a R—COOH group may be used as the head-group. In this case, a FP may be removed as the substrate is loaded onto the substrate holder. This results in the formation of a charged R-coo- group on the substrate backside surface which is able to interact strongly with the surface of the substrate holder. A carboxylate salt, such as R-COONa may also be used. In this case, a metal cation (e.g. Nat) may be removed, resulting in a negatively charged R-COO⁻ anion which is able to interact strongly with the surface of the substrate holder. An example of a molecule comprising a R-coo⁻head-group is depicted in FIG. 11A. Alternatively, the one or more groups which can become charged may form a positively charged group. For example, a group such as R—NH₃Cl may be used. An anion (e.g. Cl⁻) may be removed, resulting in a positively charged R—NH₃⁺cation which is able to interact strongly with the surface of the substrate holder. An example of a molecule comprising a R—NH₃+head-group is depicted in FIG. 11B. While certain charged groups have been exemplified as the head-group, any groups capable of forming charged species may be used.

The present invention also relates to methods for producing substrates comprising backside surfaces comprising the coatings described herein.

While the approaches herein have been described in relation to coating the backside surfaces of substrates intended for use with substrate holders during lithography, such approaches are equally applicable to coating the surface of substrate holders generally, such that a friction switch is achieved when a substrate is loaded onto the substrate holder.

According to an embodiment, in reference to FIG. 3, an atmosphere 27 between the substrate backside 25 and the base surface 23 may comprise a gas mixture comprising a coating as described above. The gas mixture may be conditioned by the supply and extraction channels 28 provided at the substrate support 20. Herewith, a coating may be applied to the backside 25 of the substrate W and/or to the base surface 23. The substrate support 20 may comprise a plurality of supply and extraction channels 28 to provide the gas mixture evenly at the substrate backside 25 and/or the base surface 23 of the substrate support.

While the substrate holder can comprise any material selected from DLC, diamond, graphite, SiSiC, SiC, Zerodur, Al₂O₃,TiN, Lipocer, SST and/or CrN, the substrate holder preferably comprises one or more of diamond-like carbon (DLC), diamond, graphite, SiSiC and/or SiC.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, micro-electrical-mechanical systems (MEMS) etc.

Aspects of the invention are set out in the clauses below.

1. A substrate with a backside surface configured to provide a friction switch when the substrate is loaded onto a substrate holder in a substrate-loading cycle; wherein the substrate backside surface comprises a molecular assembly comprising at least one high-interaction region and at least one low-interaction region.

2. The substrate of clause 1, wherein the backside surface is configured to provide an increase in the coefficient of friction (COF) of at least about 0.05 during the substrate-loading cycle.

3. The substrate of clause 1 or clause 2, wherein the high-interaction region comprises at least one group selected from an amine, alcohol, peroxy, ester, amide, urea, imine, imide, nitrile, ether, siloxy, alkoxy, acyl, carboxyl, acetyl and/or a charged group.

4. The substrate of any one of clauses 1 to 3, wherein the low-interaction region comprises a carbon chain comprising one or more moieties selected from —CX3, —CX2H, —CXH₂, —CH3, —CX₂—,— CXH—, and/or —CH₂—, wherein X is independently selected from F and Cl.

5. The substrate of any one of clauses 1 to 4, wherein the at least one high-interaction region within the molecular assembly can interact with other species by one or more interaction mechanisms selected from coulombic interaction, hydrogen-bonding and magnetic dipole-dipole interaction.

6. The substrate of any one of clauses 1 to 5 wherein the at least one low-interaction region within the molecular assembly can interact with other species by only Van der Waals intermolecular forces.

7. The substrate of any one of clauses 1 to 6, wherein the molecular assembly consists of one type of molecule, which comprises at least one high-interaction and at least one low-interaction region.

8. The substrate of any one of clauses 1 to 6, wherein the molecular assembly comprises two or more types of molecules.

9. The substrate of any one of clauses 1 to 6 or clause 8, wherein the at least one high-interaction region is provided by gas molecules absorbed to the surface of the substrate backside surface.

10. The substrate of any one of clauses 1 to 9, wherein the molecular assembly covers from about 30% to about 70% of the substrate backside surface.

11. The substrate of any one of clauses 1 to 10, wherein the substrate is a silicon wafer or a silicon carbide wafer.

12. A method comprising loading a substrate as defined in any one of clauses 1 to 11 onto a substrate holder; wherein the at least one low-interaction region of the substrate backside surface contacts the surface of the substrate holder before the at least one high-interaction region of the substrate backside surface during loading of the substrate.

13. The method of clause 12, wherein the coefficient of friction (COF) increases by at least about 0.1 during the substrate-loading cycle.

14. The method of clause 12 or clause 13, wherein the coefficient of friction (COF) increases by at least about 0.2 during the substrate-loading cycle.

15. The method of any one of clauses 12 to 14, wherein the substrate holder comprises one or more of DLC, diamond, graphite, SiSiC and/or SiC.

16. A method comprising processing a substrate supported by a substrate holder, wherein the substrate is as defined in any one of clauses 1 to 11.

17. A method of coating the backside surface of a substrate with a friction-switch coating, comprising applying a molecular species comprising at least one low-interaction region to a first portion of the backside surface of the substrate, and applying a molecular species comprising at least one high-interaction region to a second portion of the backside surface of the substrate.

18. The method of clause 17, wherein the high-interaction region comprises at least one group selected from an amine, alcohol, peroxy, ester, amide, urea, imine, imide, nitrile, ether, siloxy, alkoxy, acyl, carboxyl, acetyl and/or a charged group.

19. The method of clause 17 or clause 18, wherein the low-interaction region comprises at least one moiety selected from —CX3, —CX2H, —CXH$_2$, —CH3, —CX$_2$—, —CXH— and/or —CH$_2$—, wherein X is independently selected from F and Cl.

20. The method of any one of clauses 17 to 19, wherein the high-interaction region can interact with other species by one or more interaction mechanisms selected from coulombic interaction, hydrogen-bonding and magnetic dipole-dipole interaction.

21. The method of any one of clauses 17 to 20, wherein the low-interaction region can interact with other species by only Van der Waals forces.

22. A method of coating the backside surface of a substrate with a friction-switch coating, comprising applying a molecular species to a portion of the backside surface of the substrate, wherein the molecular species comprises at least one high-interaction and at least one low-interaction region.

23. The method of clause 22, wherein the high-interaction region comprises at least one group selected from an amine, alcohol, peroxy, ester, amide, urea, imine, imide, nitrile, ether, siloxy, alkoxy, acyl, carboxyl, acetyl and/or a charged group.

24. The method of clause 22 or clause 23, wherein the low-interaction region comprises at least one moiety selected from —CX3, —CX2H, —CXH$_2$, —CH3, —CX$_2$—, —CXH— and/or —CH$_2$—, wherein X is independently selected from F and Cl.

25. The method of any one of clauses 22 to 24, wherein the high-interaction region can interact with other species by one or more interaction mechanisms selected from coulombic interaction, hydrogen-bonding and magnetic dipole-dipole interaction.

26. The method of any one of clauses 22 to 25, wherein the low-interaction region can interact with other species by only Van der Waals forces.

27. A method of coating the backside of a substrate with a friction-switch coating, comprising applying a molecular species comprising at least one low-interaction region to a first portion of the backside surface of the substrate, and applying gas molecules comprising at least one high-interaction region to a second portion of the backside surface of the substrate, wherein at least a portion of the gas molecules adsorb onto the substrate backside surface.

28 The method of clause 16, wherein the molecular species comprising at least one low-interaction region releases said gas molecules upon reaction with the substrate backside surface.

29. The method of clause 27 or clause 28, wherein the high-interaction region comprises at least one group selected from an amine, alcohol, peroxy, ester, amide, urea, imine, imide, nitrile, ether, siloxy, alkoxy, acyl, carboxyl, acetyl and/or a charged group.

30. The method of any one of clauses 27 to 29, wherein the low-interaction region comprises at least one moiety selected from —CX3, —CX2H, —CXH$_2$, —CH3, —CX$_2$—, —CXH— and/or —CH$_2$—, wherein X is independently selected from F and Cl.

31. The method of any one of clauses 27 to 30, wherein the high-interaction region can interact with other species by one or more interaction mechanisms selected from coulombic interaction, hydrogen-bonding and magnetic dipole-dipole interaction.

32. The method of any one of clauses 27 to 31, wherein the low-interaction region can interact with other species by only Van der Waals forces.

33. The method of any one of clauses 27 to 32, wherein the molecular species comprising at least one low-interaction region additionally comprises at least one alkoxy group.

34. The method of any one of clauses 27 to 33, wherein the one or more gas molecules comprises isopropanol.

35. A method of providing a friction-switch during loading of a substrate onto a substrate holder, comprising: applying a first molecular species comprising at least one low-interaction region to a first portion of the backside surface of the substrate; and applying a second molecular species to a second portion of the backside surface of the substrate; and loading the substrate onto the substrate holder; wherein the second molecular species reacts during loading of the substrate to form a high-interaction region.

36. The method of clause 35, wherein the high-interaction region comprises at least one group selected from an amine, alcohol, peroxy, ester, amide, urea, imine, imide, nitrile, ether, siloxy, alkoxy, acyl, carboxyl, acetyl and/or a charged group.

37. The method of clause 35 or clause 36, wherein the high-interaction region comprises a charged group.

38. The method of any one of clauses 35 to 37, wherein the low-interaction region comprises at least one moiety selected from —CX3, —CX2H, —CXH$_2$, —CH3, —CX$_2$—, —CXH— and/or —CH$_2$—, wherein X is independently selected from F and Cl.

39. The method of any one of clauses 35 to 38, wherein the high-interaction region interacts with the substrate holder surface by one or more interaction mechanisms selected from coulombic interaction, hydrogen-bonding and magnetic dipole-dipole interaction.

40. The method of any one of clauses 35 to 39, wherein the high-interaction region interacts with the substrate holder surface by coulombic interaction.

41. The method of any one of clauses 35 to 40, wherein the low-interaction region interacts with the substrate holder surface by only Van der Waals forces.

42. An apparatus configured to apply a radiation beam to a substrate, and configured to apply a method as defined in any one of clauses 17 to 41.

43. A method of fabricating a device, the method comprising: loading a substrate onto a substrate holder exposing the substrate to a radiation beam to produce an exposed substrate; and processing the exposed substrate to produce a device, wherein the substrate is as defined in any one of clause 1 to 11.

44. The method of clause 43, wherein the COF between the substrate and the substrate holder increases by at least 0.1 as the substrate is loaded onto the substrate holder.

45. The method of clause 43 or clause 44, wherein the method additionally comprises applying a method as defined in any one of clauses 17 to 34 before conducting step a).

46. A method of fabricating a device, the method comprising: applying the method of any one of clauses 35 to 41 exposing the substrate to a radiation beam to produce an exposed substrate; and processing the exposed substrate to produce a device.

47. The method of clause 46, wherein the COF between the substrate and the substrate holder increases by at least 0.1 as the substrate is loaded onto the substrate holder.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A substrate with a backside surface configured to provide a friction switch when the substrate is loaded onto a substrate holder in a substrate-loading cycle, wherein the substrate backside surface comprises a molecular assembly covering at least part of the backside surface, the molecular assembly comprising at least one high-interaction region provided by material of the molecular assembly and at least one low-interaction region provided by material of the molecular assembly.

2. The substrate of claim 1, wherein the molecular assembly is configured to provide an increase in coefficient of friction (COF) of at least about 0.05 during the substrate-loading cycle.

3. The substrate of claim 1, wherein the at least one high-interaction region comprises at least one group selected from: an amine, alcohol, peroxy, ester, amide, urea, imine, imide, nitrile, ether, siloxy, alkoxy, acyl, carboxyl, acetyl and/or a charged group.

4. The substrate of claim 1, wherein the at least one low-interaction region comprises a carbon chain comprising one or more moieties selected from: —$CX_3$, —$CX_2H$, —$CXH_2$, —$CH_3$, —$CX_2$—, —CXH—, and/or —$CH_2$—, wherein X is independently selected from F and Cl.

5. The substrate of claim 1, wherein the at least one high-interaction region can interact with other species by one or more interaction mechanisms selected from: coulombic interaction, hydrogen-bonding and/or magnetic dipole-dipole interaction.

6. The substrate of claim 1, wherein the at least one low-interaction region can interact with other species by only Van der Waals intermolecular forces.

7. The substrate of claim 1, wherein the molecular assembly consists of one type of molecule, which comprises at least one high-interaction region and at least one low-interaction region.

8. The substrate of claim 1, wherein the molecular assembly comprises two or more types of molecules.

9. The substrate of claim 1, wherein the at least one high-interaction region is provided by gas molecules absorbed to the surface of the substrate backside surface.

10. A method comprising loading a substrate as defined in claim 1 onto a substrate holder, wherein the at least one low-interaction region contacts the surface of the substrate holder before the at least one high-interaction region during loading of the substrate.

11. An apparatus configured to apply a radiation beam to a substrate, and configured to apply the method as defined in claim 10.

12. A method of fabricating a device, the method comprising:
loading a substrate onto a substrate holder;
exposing the substrate to a radiation beam to produce an exposed substrate; and
processing the exposed substrate to produce a device, wherein the substrate is as defined in claim 1.

13. The substrate of claim 1, wherein the molecular assembly covers from about 30% to about 70% of the substrate backside surface.

14. A method of coating a backside surface of a substrate with a friction-switch coating configured to provide a friction switch when the substrate is loaded onto a substrate support, the method comprising:
applying a molecular species comprising at least one low-interaction region of the friction-switch coating to a first portion of the backside surface of the substrate, and
applying a molecular species comprising at least one high-interaction region of the friction-switch coating to a second portion of the backside surface of the substrate.

15. The method of claim 14, wherein the at least one high-interaction region comprises at least one group selected from: an amine, alcohol, peroxy, ester, amide, urea, imine, imide, nitrile, ether, siloxy, alkoxy, acyl, carboxyl, acetyl and/or a charged group.

16. The method of claim 14, wherein the at least one low-interaction region comprises at least one moiety selected from: —$CX_3$, —$CX_2H$, —$CXH_2$, —$CH_3$, —$CX_2$—, —CXH— and/or —$CH_2$—, wherein X is independently selected from F and Cl.

17. A method of coating a backside surface of a substrate with a friction-switch coating configured to provide a friction switch when the substrate is loaded onto a substrate support, the method comprising:
applying a molecular species comprising at least one low-interaction region of the friction-switch coating to a first portion of the backside surface of the substrate, and
applying gas molecules comprising at least one high-interaction region of the friction-switch coating to a second portion of the backside surface of the substrate, wherein at least a portion of the gas molecules adsorb onto the substrate backside surface.

18. A method of providing a friction-switch during loading of a substrate onto a substrate holder, the method comprising:
applying a first molecular species comprising at least one low-interaction region of a friction-switch coating to provide the friction-switch to a first portion of the backside surface of the substrate;
applying a second molecular species to a second portion of the backside surface of the substrate; and
loading the substrate onto the substrate holder,
wherein the second molecular species reacts during loading of the substrate to form a high-interaction region of the friction-switch coating.

19. The method of claim 18, wherein the high-interaction region comprises at least one group selected from: an amine, alcohol, peroxy, ester, amide, urea, imine, imide, nitrile, ether, siloxy, alkoxy, acyl, carboxyl, acetyl and/or a charged group.

20. The method of claim 18, wherein the at least one low-interaction region comprises at least one moiety selected from: —$CX_3$, —$CX_2H$, —$CXH_2$, —$CH_3$, —CX$_2$—, —CXH— and/or —CH$_2$—, wherein X is independently selected from F and Cl.

\* \* \* \* \*

UNITED STATES PATENT AND TRADEMARK OFFICE
CERTIFICATE OF CORRECTION

PATENT NO. : 11,740,566 B2  
APPLICATION NO. : 17/790986  
DATED : August 29, 2023  
INVENTOR(S) : Paulus Albertus Van Hal et al.

Page 1 of 1

It is certified that error appears in the above-identified patent and that said Letters Patent is hereby corrected as shown below:

On the Title Page

Item (54) and in the Specification, Column 1, Line 1:
Please correct "LITHOGRAPHY APPARATUS" to -- IMPROVED LITHOGRAPHY APPARATUS --.

Signed and Sealed this
Twenty-sixth Day of September, 2023

Katherine Kelly Vidal
*Director of the United States Patent and Trademark Office*